(12) United States Patent
Ikeda et al.

(10) Patent No.: US 9,252,679 B2
(45) Date of Patent: Feb. 2, 2016

(54) REVERSE RECOVERY CURRENT PREVENTION DEVICE AND MOTOR DRIVING APPARATUS

(75) Inventors: Motonobu Ikeda, Sakai (JP); Satoshi Yagi, Sakai (JP); Sumio Kagimura, Sakai (JP)

(73) Assignee: Daikin Industries, Ltd., Osaka (JP)

(*) Notice: Subject to any disclaimer, the term of this patent is extended or adjusted under 35 U.S.C. 154(b) by 906 days.

(21) Appl. No.: 13/515,245

(22) PCT Filed: Dec. 2, 2010

(86) PCT No.: PCT/JP2010/071556
§ 371 (c)(1),
(2), (4) Date: Jun. 11, 2012

(87) PCT Pub. No.: WO2011/077919
PCT Pub. Date: Jun. 30, 2011

(65) Prior Publication Data
US 2012/0286708 A1    Nov. 15, 2012

(30) Foreign Application Priority Data
Dec. 24, 2009  (JP) ................. 2009-292893

(51) Int. Cl.
| H02P 27/00 | (2006.01) |
| H02M 7/06 | (2006.01) |
| H03K 17/0814 | (2006.01) |
| H02P 29/02 | (2006.01) |
| H02P 3/18 | (2006.01) |
| H02M 1/32 | (2007.01) |

(52) U.S. Cl.
CPC ............ *H02M 7/062* (2013.01); *H02P 3/18* (2013.01); *H02P 29/028* (2013.01); *H03K 17/08148* (2013.01); *H02M 1/32* (2013.01)

(58) Field of Classification Search
CPC .......... F41A 19/58; F41A 19/65; F42B 30/10; F42B 4/00; F42B 4/02
See application file for complete search history.

(56) References Cited

U.S. PATENT DOCUMENTS 5,182,702 A * 1/1993 Hiramatsu ............ H02M 1/425
                                                          315/247
5,251,119 A * 10/1993 Maehara ............ H02M 1/4241
                                                          315/226

FOREIGN PATENT DOCUMENTS

| JP | 4-207971 A | 7/1992 |
| JP | 2000-230752 A | 8/2000 |

(Continued)

OTHER PUBLICATIONS

International Search Report of corresponding PCT Application No. PCT/JP2010071556.

(Continued)

*Primary Examiner* — Shawki S Ismail
*Assistant Examiner* — Zoheb Imtiaz
(74) *Attorney, Agent, or Firm* — Global IP Counselors (57) ABSTRACT

A reverse recovery current prevention device includes a full wave rectifier having a plurality of diodes, first and second diodes, a switch part and a switch control unit. The full wave rectifier rectifies a power source voltage from an alternating current power source inputted into first and second input terminals. The first and second diodes have anode terminals connected to the first and second input terminals, respectively. The switch part opens or shorts an electrical circuit between a negative-side output terminal of the full wave rectifier and each cathode terminal of the first and second diodes. The switch control unit prohibits the switch part from shorting the electrical circuit between the negative-side output terminal and each of the cathode terminals when a voltage between the negative-side output terminal and each of the cathode terminals is at or above a threshold.

10 Claims, 6 Drawing Sheets

(56) References Cited

FOREIGN PATENT DOCUMENTS

| JP | 2002-199730 A | 7/2002 |
| JP | 2007-274818 A | 10/2007 |

OTHER PUBLICATIONS

International Preliminary Report of corresponding PCT Application No. PCT/JP2010/071556.

* cited by examiner

(PRIOR ART)

REVERSE RECOVERY CURRENT PREVENTION DEVICE AND MOTOR DRIVING APPARATUS

CROSS-REFERENCE TO RELATED APPLICATIONS

This U.S. National stage application claims priority under 35 U.S.C. §119(a) to Japanese Patent Application No. 2009-292893, filed in Japan on Dec. 24, 2009, the entire contents of which are hereby incorporated herein by reference.

TECHNICAL FIELD

The present invention relates to a reverse recovery current prevention device. The present invention also relates to a motor driving apparatus for driving a motor, the motor driving apparatus being provided with the reverse recovery current prevention device.

BACKGROUND ART

In the past, motors have often been used as a drive source for fans, air ventilators, and various other machines. Generally, a motor is driven by a motor driving apparatus having a full wave rectifier for performing full wave rectification on alternating current voltage from an alternating current power source, and/or an inverter unit for using rectified voltage to generate a drive voltage for driving the motor. However, there have been problems in the motor driving apparatus, such as a decrease in the power factor because of a distortion in the input current from the alternating current power source flowing into the full wave rectifier.

Figure 1:
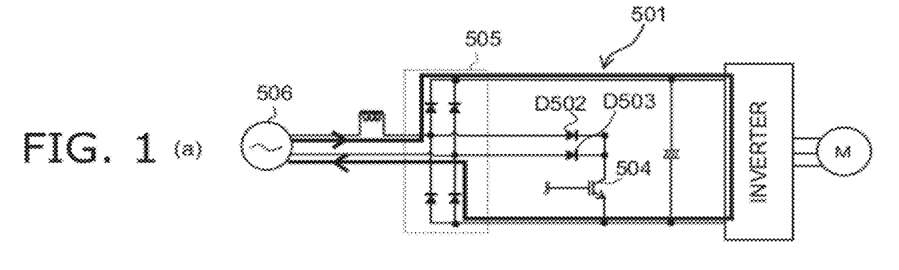
FIG. 1A is a drawing illustrating a pathway of a current flowing through a rectification device according to Japanese Laid-open Patent Application 2007-274818 when a switching element is turned off, within a circuitry diagram of the rectification device.
FIG. 1B is a drawing illustrating a pathway of a reverse recovery current flowing through the rectification device according to Japanese Laid-open Patent Application 2007-274818 when the switching element is faultily turned on during the state of FIG. 1A within the circuitry diagram of the rectification device.

To counter this problem, a rectification device 501 disclosed in Japanese Laid-open Patent Application 2007-274818 is known as a technology for improving the power factor (see FIG. 1). The rectification device 501 is primarily provided with a full wave rectifier 505, two rectification diodes D502, D503, and one switching element 504 constituted of, for example, a transistor. Each of the anode terminals of the rectification diodes D502, D503 is connected to the alternating current input terminals of each of the phases of the full wave rectifier 505, and each of the cathode terminals is connected to a positive electrode of the switching element 504. A negative electrode of the switching element 504 is connected to a negative-side output terminal of the full wave rectifier 505. In such a rectification device 501, the switching element 504 is turned on and off by a microcomputer (not shown) such that the input current flowing into the full wave rectifier 505 becomes a sine wave, and such that the voltage phase and the current phase are in conformity.

SUMMARY

Technical Problem

However, in the rectification device 501 of Japanese Laid-open Patent Application 2007-274818, the aforesaid microcomputer (not shown) in some cases performs erratically in a state where the current flows as illustrated by the arrow in FIG. 1A, specifically, when the input current from an alternating current power source 506 flows into the full wave rectifier 505 and the switching element 504 is turned off. In so doing, the switching element 504, which should be turned off, faultily turns on, and a current pathway which includes the switching element 504, for example as illustrated by the arrow in FIG. 1B, is further formed, and a so-called reverse recovery current flows into the rectification device 501. In particular, the instant the switching element 504 is turned on, a comparatively large reverse recovery current instantly flows into the switching element 504, and accordingly there is the risk that the switching element 504 will be destroyed by this current.

In view whereof, it is an objective of the present invention to provide a reverse recovery current prevention device capable of preventing a switching element from being destroyed by a reverse recovery current, and to provide a motor driving apparatus provided with the same.

Solution to Problem

A reverse recovery current prevention device according to a first aspect of the invention comprises a full wave rectifier, a first diode, a second diode, a switch part, and a switch control unit. A full wave rectifier is constituted of a plurality of diodes. The full wave rectifier rectifies power source voltage, from an alternating current power source, inputted into a first input terminal and a second input terminal. The first diode has an anode terminal which is connected to the first input terminal of the full wave rectifier. The second diode has an anode terminal which is connected to the second input terminal of the full wave rectifier. The switch part creates a connection between a negative-side output terminal of the full wave rectifier and each of the cathode terminals of the first diode and the second diode. The switch part either opens or shorts an electrical circuit between the negative-side output terminal and each of the cathode terminals. The switch control unit prohibits the switch part from shorting the electrical circuit between the negative-side output terminal and each of the cathode terminals in a case where the voltage between the negative-side output terminal and each of the cathode terminals is at or above a threshold.

According to the reverse recovery current prevention device, in a case where the voltage between a negative-side voltage terminal of the full wave rectifier and each of the cathode terminals of the first diode and the second diode, i.e., the voltage at both ends of the switch part, is at or above the threshold and is increasing, then in terms of the circuit configuration, an input current is assumed to be flowing from the alternating current power source toward the full wave rectifier. In view of this, in such a case, the switch control unit prohibits the switch part from shorting the electrical circuit between the negative-side voltage terminal of the full wave rectifier and each of the cathode terminals of the first and second diodes. This causes the state between the negative-side voltage terminal of the full wave rectifier and each of the cathode terminals of the first and second diodes to be electrically opened while the input current is flowing toward the full wave rectifier, and prevents the formation of a current pathway for a reverse recovery current, wherefore no reverse recovery current will flow the switch part. It is accordingly possible to prevent the switch part from being destroyed.

A reverse recovery current prevention device according to a second aspect of the invention is the revere recovery current prevention device according to the first aspect, further comprising a voltage detector. The voltage detector detects the voltage between the negative-side output terminal and each of the cathode terminals. The switch control unit compares a first detection result from the voltage detector with a threshold.

This makes it possible for the switch control unit to identify the voltage between the negative-side output terminal of the full wave rectifier and each of the cathode terminals of the first and second diodes, i.e., the voltage at both ends of the switch part, and also makes it possible to control the state of the switch part by the comparison between the voltage and the threshold.

A reverse recovery current prevention device according to a third aspect of the invention is the reverse recovery current prevention device according to the second aspect, further comprising a zero-crossing detector. The zero-crossing detector detects the zero-crossing of the power source voltage. The switch control unit further prohibits the switch part from shorting the electrical circuit between the negative-side output terminal and each of the cathode terminals on the basis of a second detection result from the zero-crossing detector.

The switch control unit of the reverse recovery current prevention device prohibits short-circuiting not only on the basis of the first detection result, which is the voltage between the negative-side voltage terminal of the full wave rectifier and each of the cathode terminals of the first and second diodes, i.e., the voltage at both ends of the switch part, but also on the basis of the second detection result, which is the detection result of the zero-crossing detector, and can therefore more reliably prevent the switch part from being destroyed.

A reverse recovery current prevention device according to a fourth aspect of the invention is the reverse recovery current prevention device according to the third aspect, wherein the switch part is constituted of a switching element. The switch control unit has a signal output unit and a logical AND circuit. The signal output unit outputs a second pulse signal, which is a signal relating to a threshold, on the basis of the second detection result from the zero-crossing detector. The logical AND circuit calculates, and outputs to the switching element, the logical AND of the second pulse signal and a first pulse signal indicating the first detection result from the voltage detector.

The switch control unit according to the reverse recovery current prevention device can be constituted merely of the signal output unit and the logical AND circuit. Herein, the first pulse signal refers to a signal that is indicative of the voltage between the negative-side voltage terminal of the full wave rectifier and each of the cathode terminals of the first and second diodes, i.e., the voltage at both ends of the switch part. The second pulse signal refers to a signal generated on the basis of the detection result of the zero-crossing detector, and is a signal which is indicative of, for example, whether or not the alternating current voltage is at or above the threshold.

A reverse recovery current prevention device according to a fifth aspect of the invention is the reverse recovery current prevention device according to any of the first to fourth aspects, wherein the switch control unit causes the electrical circuit between the negative-side output terminal and each of the cathode terminals to be shorted by the switch part at a time where the current is flowing out from the alternating current power source toward the full wave rectifier, the timing being in the vicinity of the zero-crossing of the power source voltage. A threshold is set to be higher than the power source voltage when the switch part shorts the electrical circuit between the negative-side output terminal and each of the cathode terminals.

According to the reverse recovery current prevention device, the threshold can be made to be a value suited to a control for forcibly prohibiting the switching element from turning on.

A reverse recovery current prevention device according to a sixth aspect of the invention is the reverse recovery current prevention device according to any of the first to fifth aspects, further comprising a smoothing unit. The smoothing unit smoothes the power source voltage having been rectified by the full wave rectifier. A threshold is set to be lower than the power source voltage when current is flowing out from the alternating current power source toward the full wave rectifier, because the direct current voltage is lower than the power source voltage.

In a case where the direct current voltage is less than the power source voltage and current is flowing into the full wave rectifier from the alternative current power source, there is presented a risk of a reverse recovery current flowing to the switch part. However, according to the reverse recovery current prevention device, the threshold used in the control for beginning to forcibly prohibit the switch part from turning on is set to be lower than the power source voltage when the direct current voltage becomes lower than the power source voltage and the current is flowing out from the alternating current power source to the full wave rectifier. For this reason, it is possible to forcibly prohibit the switch part from turning on in advance of a state being reached where the prevailing relationship in which the power source voltage is lower than the direct current voltage is reversed so that the power source voltage becomes higher than the direct current voltage, and the reverse recovery current must be taken into account. It is accordingly possible to more reliably prevent the switch part from being destroyed.

A motor driving apparatus according to a seventh aspect of the invention is an apparatus for driving a motor. The motor driving apparatus is provided with an inverter unit, and also with the reverse recovery current prevention device according to any of the aforesaid first to sixth aspects. The inverter unit comprises a plurality of switching elements which are connected in series with each other, and outputs, to the motor, a driving voltage for driving the motor. The reverse recovery current prevention device is provided to an upstream part of the inverter unit.

Of the reverse recovery current, a transient current flowing into the switch part the instant where the switch part is turned on in particular is a source of noise, and therefore there is presumably also an adverse effect on a microcomputer for controlling the driving of the inverter and on other elements of the motor driving apparatus. However, the motor driving apparatus according to the present invention has the reverse recovery current prevention device according to any of the aforesaid first to sixth aspects built into the motor driving apparatus, and therefore the reverse recovery current will no longer flow to the switch part. Accordingly, the motor driving apparatus can drive the motor without problems and without being affected by any reverse recovery current.

Advantageous Effects of Invention

According to the reverse recovery current prevention device according to the first aspect of the invention, the state between the negative-side voltage terminal of the full wave rectifier and each of the cathode terminals of the first and second diodes becomes electrically opened while the input current is flowing toward the full wave rectifier, and the formation of a current pathway for a reverse recovery current is prevented, therefore no reverse recovery current will flow the switch part. It is accordingly possible to prevent the switch part from being destroyed.

According to the reverse recovery current prevention device according to the second aspect of the invention, the switch control unit can know the voltage between the negative-side output terminal and each of the cathode terminals of the first and second diodes, and can control the state of the switch part by the comparison between the voltage and the threshold.

According to the reverse recovery current prevention device according to the third aspect of the invention, the switch part can be more reliably prevented from being destroyed.

The switch control unit of the reverse recovery current prevention device according to the fourth aspect of the invention can be constituted merely of the signal output unit and the logical AND circuit.

According to the reverse recovery current prevention device according to the fifth aspect of the invention, the threshold can be made to be a value suited to a control tier forcibly prohibiting the switching element from turning on.

The reverse recovery current prevention device according to the sixth aspect of the invention is capable of forcibly prohibiting the switch part from turning on in advance, and therefore is capable of more reliably preventing the switch part from being destroyed.

The motor driving apparatus according to the seventh aspect of the invention can drive the motor without problems and without being affected by any reverse recovery current.

BRIEF DESCRIPTION OF THE DRAWINGS

FIG. 6A is a graph illustrating a current that flows into the switching element in the case of the present embodiment where, while the input current is flowing to the full wave rectifier, the switching element is forcibly prohibited from turning on.

FIG. 6B is a graph illustrating a current that flows into the switching element in a conventional example where, while the input current is flowing to the full wave rectifier, the switching element is allowed to turn on.

DESCRIPTION OF EMBODIMENTS

The following provides a more detailed description, with reference to the accompanying drawings, of the reverse recovery current prevention device and motor driving apparatus according to the present invention.

(1) Overall Configuration

Figure 2:
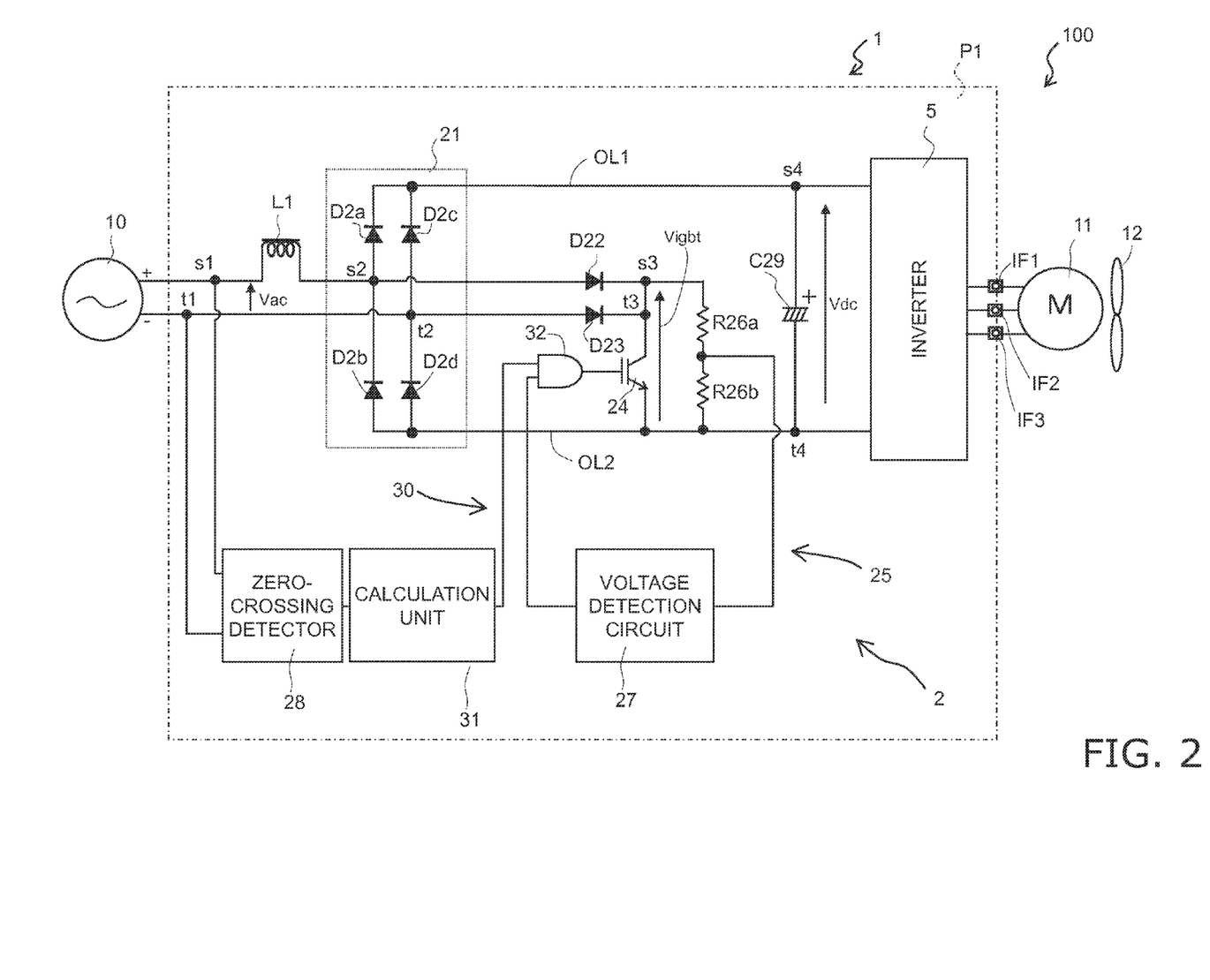
FIG. 2 is a drawing illustrating the configurations of a reverse recovery current prevention device according to the present embodiment, a motor driving apparatus provided with the reverse recovery current prevention device, and a motor driving system provided with the motor driving apparatus and a motor.

FIG. 2 is a drawing of the configuration of a motor driving apparatus 1, a reverse recovery current prevention device 2, and a motor driving system 100 according to one embodiment of the present invention. The motor driving system 100 is provided with a motor 11 as well as with the motor driving apparatus 1 for driving the motor 11.

A description of the motor 11 shall now be provided. The motor 11 is a driving source for an outdoor fan 12 according to an outdoor unit of an air conditioner, and can be, for example, a three-phase brushless DC motor. Although not depicted, the motor 11 has a starter constituted of a plurality of driving coils, a rotor constituted of a permanent magnet, a Hall element for detecting the position of the rotor relative to the starter, and the like.

The motor driving apparatus 1 is provided with the reverse recovery current prevention device 2 according to the present embodiment and with an inverter unit 5. Although not depicted, the motor driving apparatus 1 further has a microcomputer for controlling the inverter unit 5.

The reverse recovery current prevention device 2 is a device for preventing a so-called reverse recovery current, and is provided to a front step portion of the inverter unit 5, namely, is provided closer not to the motor 11 but rather to an alternating current power source 10, which is a commercial power source, than the inverter unit 5. A more detailed description of the reverse recovery current prevention device 2 shall be provided below.

Figure 3:
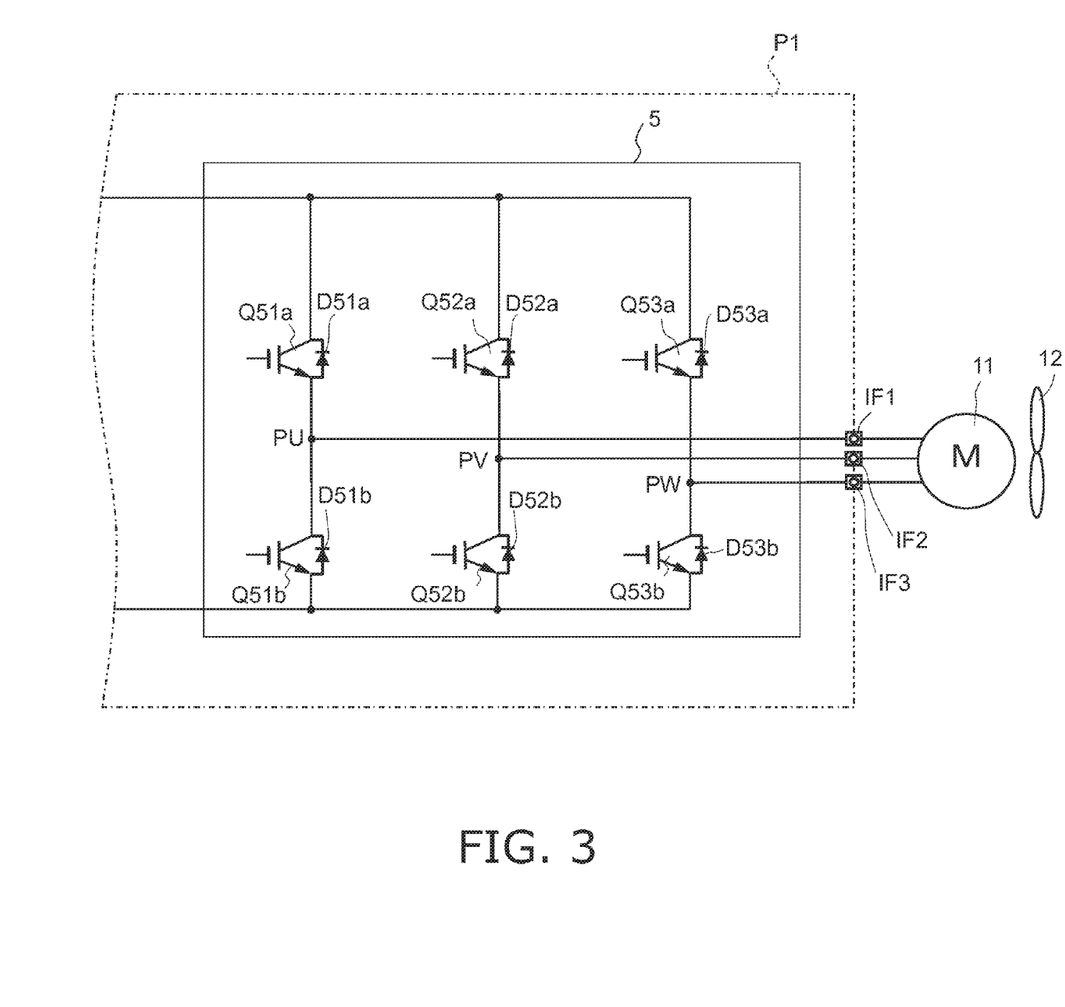
FIG. 3 is a drawing illustrating the configuration within an inverter unit provided to the motor driving apparatus.

The inverter unit 5, as illustrated in FIG. 3, comprises a plurality of transistors Q51a, Q52a, Q52b, Q53a, Q53b, and a plurality of flyback diodes D51a, D51b, D52a, D52b, D53a, D53b. Mutual connections in series exist between the transistors Q51a and Q51b, between the transistors Q52a and Q52b, and between the transistors Q53a and Q53b, and each of the diodes D51a to D53b is connected in parallel with each of the transistors Q51a to Q53b. In the inverter unit 5, each of the transistors Q51a to Q53b turns on and off at predetermined times, thereby generating a driving voltage for driving the motor 11, which voltage is then outputted to the motor 11. The operation that each of the transistors Q51a to Q53b turns on and off is controlled by the microcomputer (not shown).

In the present embodiment, as illustrated in FIG. 2, in addition to the inverter unit 5 and the reverse recovery current prevention device 2 constituting the motor driving apparatus 1, a reactor L1 connected to the alternating current power source 10 is installed on a printed substrate P1, the printed substrate P1 being coupled to the motor 11 via three interfaces, IF1, IF2, IF3. The previously described driving voltage is outputted toward the motor 11 from the substrate P1, and the motor 11 is driven to rotate.

(2) Configuration of Reverse Recovery Current Prevention Device

Next, a specific description of the configuration of the reverse recovery current prevention device 2 according to the present embodiment shall now be provided.

The reverse recovery current prevention device 2, as illustrated in FIG. 2, is primarily provided with a full wave rectifier 21, a first diode D22, a second diode D23, a switching element 24 (which corresponds to a switch part), a voltage detector 25, a zero-crossing detector 28, a smoothing condenser C29 (which corresponds to a smoothing unit), and a switching element control unit 30 (which corresponds to a switch control unit).

{Full Wave Rectifier}

The full wave rectifier 21 is constituted in a bridge shape of a plurality of diodes D2a, D2b, D2c, D2d. Specifically, mutual connections in series exist between the diodes D2a and D2*b* and between the diodes D2*c* and D2*d*. Each of the cathode terminals of the diodes D2*a*, D2*c* is connected together on a first wiring OL1, and functions as a positive-side output terminal of the full wave rectifier 21. Each of the anode terminals of the diodes D2*b*, D2*d* is connected together on a second wiring OL2, and functions as a negative-side output terminal of the full wave rectifier 21. A first input terminal s2, which is the point of connection between the diodes D2*a*. D2*b*, is coupled to a plus-side output terminal s1 of the alternating current power source 10 via the reactor L1, and a second input terminal t2, which is the point of connection between the diodes D2*c*, D2*d*, is connected directly to a minus-side output terminal t1 of the alternating current power source 10. The alternating current power source 110 outputs alternating current voltage as a power source voltage Vac of the printed substrate P1.

The full wave rectifier 21 having such a configuration rectifies the power source voltage Vac from the alternating current power source 10 having been inputted from the first input terminal s2 and from the second input terminal t2, and is able to output the same to the first wiring OL1 and to the second wiring OL2.

{First Diode, Second Diode}

The anode terminal of the first diode D22 is connected to the first input terminal s2 of the full wave rectifier 21, and the anode terminal of the second diode D23 is connected to the second input terminal t2 of the full wave rectifier 21. To the first diode D22 and the second diode D23, in a case where a difference between the power source voltage Vac applied to the first input terminal s2 and second input terminal t2 and the voltage on the side of the cathode terminals s3, t3 is a predetermined value or greater, then current will flow from the anode side to the cathode side.

{Switching Element}

The switching element 24 is constituted of a single N-type insulated gate bipolar transistor. The switching element 24 has a collector terminal connected to the cathode terminal s3 of the first diode D22 and to the cathode terminal t3 of the second diode D23, and an emitter terminal coupled to the negative-side output terminal of the full wave rectifier 21 via the second wiring OL2. A gate terminal of the switching element 24 is connected to the switching element control unit 30, which shall be described below. Specifically, the switching element 24 is regarded to be connected between each of the cathode terminals s3, t3 of the first and second diodes D22, D23, and the negative-side output terminal of the full wave rectifier 21.

The switching element 24 having such a configuration opens or shorts the electrical circuit between the second wiring OL2 (specifically, the negative-side output terminal of the full wave rectifier 21) and each of the cathode terminals s3, t3 of the first diode D22 and second diode D23, in accordance with a gate voltage applied to the gate terminal. In the present embodiment, since the switching element 24 is an Nch transistor, the switching element 24 turns on and shorts the connection between the negative-side output terminal and each of the cathode terminals s3, t3 when a gate voltage higher than a predetermined value is applied to the gate terminal. Conversely, the switching element 24 turns off and opens the connection between the negative-side output terminal and each of the cathode terminals s3, t3 when a gate voltage lower than the predetermined value is applied to the gate terminal.

{Voltage Detector}

The voltage detector 25 detects a voltage between the negative-side output terminal of the full wave rectifier 21 and each of the cathode terminals s3, t3 of the first diode D22 and the second diode D23, i.e., a voltage Vigbt between the two ends of the switching element 24 (which corresponds to a first detection result). The voltage detector 25 is primarily constituted of two resistors R26*a*, R26*b* and a voltage detection circuit 27.

The two resistors R26*a*, R26*b* are mutually connected in series between the second wiring OL2 and each of the cathodes s3, t3 of the first diode D22 and the second diode D23. In other words, the two resistors R26*a*, R26*b* are connected in parallel to the switching element 24.

The voltage detection circuit 27 is constituted of, for example, an operational amplifier, an AD converter, a sample-and-hold circuit, and/or the like (the operational amplifier, the AD converter, and the sample-and-hold circuit is not shown in figure.). The voltage detection circuit 27 is connected to a point of connection between the resistors R26*a* and R26*b*, and is also connected to the switching element control unit 30. The voltage detection circuit 27 amplifies, to a predetermined gain, the voltage value at the point of contact between the resistors R26*a* and R26*b*, and AD-converts the voltage after amplification and retains the same for a certain period of time, whereafter the same is outputted to the switching element control unit 30 as a first pulse signal indicative of the voltage Vigbt between the two ends of the switching element 24.

Herein, with regards to the voltage Vigbt between the two ends of the switching element 24, in a case where the switching element 24 is turned on, i.e., where the circuit between the second wiring OL2 and each of the cathode terminals s3, t3 is shorted, then current will flow to the switching element 24. In such a case, the second wiring OL2 and each of the cathode terminals s3, t3 will have the same potential, and the voltage Vigbt between the two ends of the switching element 24 will be 0V (the interval in2 of the voltage Vigbt between the two ends of the switching element 24 in FIG. 4). However, in a case where the switching element 24 is turned off, i.e., where the circuit between the second wiring OL2 and each of the cathode terminals s3, t3 is opened, then no current flows to the switching element 24. In such a case, each of the cathode terminals s3, t3 will not have the same potential as the second wiring OL2 but will rather be higher than the voltage value on the second wiring OL2, and the voltage Vigbt between the two ends of the switching element 24 will become more than 0V (the intervals in1, in3 of the voltage Vigbt between the two ends of the switching element 24 in FIG. 4). Specifically, in the interval in1 in FIG. 4, the switching element 24 has been turned off and the input current is "0 A," and therefore the voltage Vigbt between the two ends becomes the power source voltage Vac. In the interval in3, the switching element 24 has been turned off, and the input current is not "0 A," and therefore the voltage Vigbt between the two ends becomes a direct current voltage Vdc.

Figure 4:
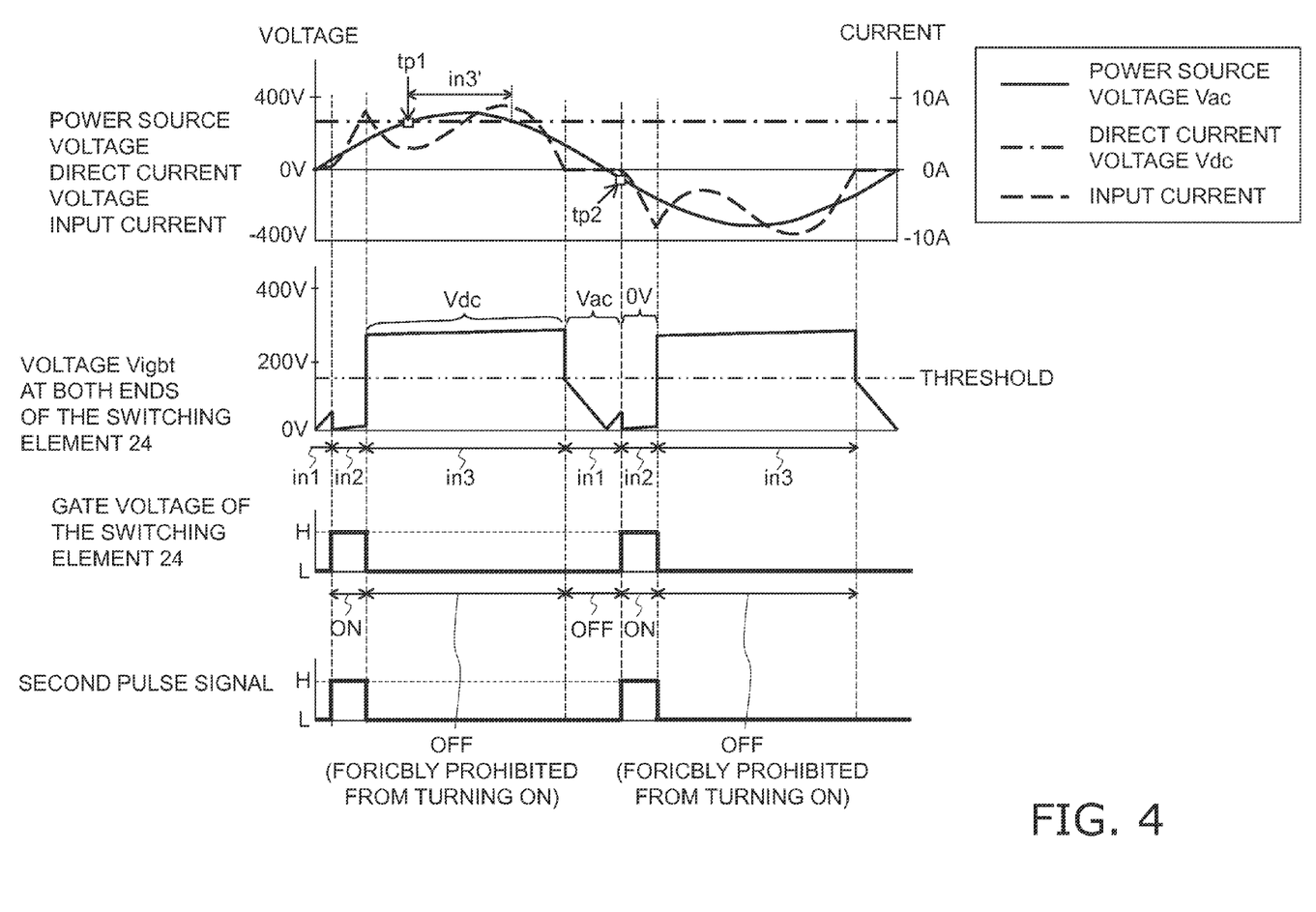
FIG. 4 is a graph illustrating the temporal changes in the power source voltage, the direct current voltage, the input current, the voltage at both ends of the switching element, the gate voltage, and the second pulse signal.

The alternating current power source Vac is an alternating current voltage, but the voltage Vigbt between the two ends of the switching element 24 in the present embodiment, for the sake of convenience, is taken to be a value represented by an absolute value (see FIG. 4).

{Zero-Crossing Detector}

The zero-crossing detector 28 is connected to the plus-side output terminal s1 and minus-side output terminal t1 of the alternating current power source 10, and is also connected to the switching element control unit 30, which shall be described below. The zero-crossing detector 28, upon detecting a zero-crossing of the power source voltage Vac from the alternating current power source 10 (the alternating current voltage), outputs the relevant detection result to the switching element control unit 30.

{Smoothing Condenser}

The smoothing condenser C29 has one end connected to the first wiring OL1 and another end connected to the second wiring OL2. The smoothing condenser C29 smoothes the power source voltage Vac having been rectified by the full wave rectifier 21 and thereby generates the direct current voltage Vdc. The direct current voltage Vdc, which is a voltage having relatively low ripple, is applied to the inverter unit 5.

Below, for the sake of convenient description, of the end parts of the smoothing condenser C29, the end part connected to the first wiring OL1 is called a high voltage-side terminal s4, and the end part connected to the second wiring OL2 is called a low voltage-side terminal t4.

{Switching Element Control Unit}

The switching element control unit 30 controls the turning on and off of the switching element 24. In particular, the switching element control unit 30 according to the present embodiment compares the voltage Vigbt between the two ends of the switching element 24 having been detected by the voltage detector 25 with a threshold, and, in a case where the comparison result is equal to or greater than the threshold, prohibits the switching element 24 from turning on and thereby shorting the electrical circuit between the second wiring OL2 and each of the cathode terminals s3, t3 of the first and second diodes D22, D23. Specifically, as illustrated in FIG. 4, in the interval in3 where the voltage Vigbt between the two ends of the switching element 24 has reached the threshold or greater, the switching element 24 is forcibly prohibited from faultily turning on due to erratic performance of the microcomputer (not shown).

The range which can be adopted by the aforesaid threshold shall now be described. According to the circuit configuration of the reverse recovery current prevention device 2 illustrated in FIG. 2, in a case where the direct current voltage Vdc generated by the smoothing condenser C29 is lower than the power source voltage Vac of the alternating current power source 10 (Vdc<Vac), then the voltage value of the high voltage-side terminal s4 of the smoothing condenser C29 will be lower than, for example, the voltage value of the first input terminal s2. In such a case, the switching element 24 would ordinarily be turned off and, as has already been described and illustrated in FIG. 1A, an input current would flow from the alternating current power source 10 toward the full wave rectifier 21. However, in this state, when the switching element 24 faultily turns on, then a reverse recovery current instead flows to the switching element 24, as illustrated in FIG. 1B. In view of this, in the present embodiment the threshold used during the control where the switching element 24 is forcibly prohibited from turning on is set to be lower than the power source voltage Vac when the input current is flowing out from the alternating current power source 10 to the full wave rectifier 21 (tp1 in FIG. 4), because the direct current voltage Vdc is lower than the power source voltage Vac (Vdc<Vac). In other words, the threshold is set such that the switching element 24 can be forcibly prohibited from turning on in advance of an interval in3', in which the prevailing relationship where the power source voltage Vac is lower than the direct current voltage (Vac<Vdc) is reversed so that the power source voltage Vac is greater than the direct current voltage Vdc (Vac>Vdc), and the need arises to consider the reverse recovery current.

The threshold is also set to be higher than the power source voltage Vac (tp2 of FIG. 4) when the switching element 24 shorts the electrical circuit between the second wiring OL2 and each of the cathode terminals s3, t3 of the first and second diodes D22, D23. As illustrated by the interval in2 in FIG. 4, the switching element 24 turns on at a time where the input current is flowing out from the alternating current power source 10 toward the full wave rectifier 21, the timing being in the vicinity of the zero-crossing of the power source voltage Vac. This is because when the power source voltage Vac is in the vicinity of the zero-crossing, there is a persistent state where the input current does not flow from the alternating current power source 10 to the full wave rectifier 21 (the interval in1), and therefore, no transient reverse recovery current will flow to the switching element 24 even though the switching element 24 may have turned on at such a time where the input flow does flow out.

A specific numerical value of the threshold is appropriately determined by a desktop calculation, simulation, experiment, or the like, on the basis of the circuitry configuration of the reverse recovery current prevention device 2. As one specific example of a numerical value of the threshold, the threshold can be set to 150V in case where, for example, the power source voltage Vac at tp1 in FIG. 4 is 300V and the power source voltage Vac at tp2 is −50V.

Further, the switching element control unit 30 according to the present embodiment performs a control for forcibly prohibiting the switching element 24 from turning on the basis of not only the comparison result between the voltage Vigbt between the two ends and the threshold, but also the zero-crossing of the power source voltage Vac as detected by the zero-crossing detector 28 (which corresponds to a second detection result).

The switching element control unit 30 of the present embodiment for performing such an operation, as illustrated by FIG. 2, has a calculation unit 31 (which corresponds to a signal output unit) and a logical AND circuit 32.

The calculation unit 31 is constituted of a microcomputer comprising a memory and a CPU, and an input terminal of the calculation unit 31 is connected to an output terminal of the zero-crossing detector 28. The calculation unit 31 generates, and outputs to the logical AND circuit 32, a second pulse signal, which is a signal relating to the threshold, on the basis of the detection result from the zero-crossing detector 28 (specifically, on the basis of whether or not the power source voltage Vac is the zero-crossing). Specifically, the calculation unit 31 outputs, to the logical AND circuit 32, the second pulse signal [indicative of] a predetermined duration of time which is triggered using the zero-crossing point of the alternating current voltage Vac as a starting point. For example, the detection result of the zero-crossing as detected by the zero-crossing detector 28 makes it possible to know the period of the power source voltage Vac. In view of this, the calculation unit 31 first calculates the period of the power source voltage Vac from the detection result of the zero-crossing detector 28, and then estimates the value of the power source voltage Vac from the calculation result. Then, the calculation unit 31 becomes able to generate the second pulse signal having a value for forcibly causing the switching element 24 to turn off even though, for example, the first pulse signal may be a value which would cause the switching element 24 to turn on after for example 2 ms from the zero-crossing of the power source voltage Vac (after a predetermined period).

The predetermined duration of time is, for example, 2 msec to 4 msec, and is appropriately determined by a desktop calculation, a simulation, or the like, on the basis of, for example, the frequency of the alternating current voltage Vac and/or the threshold. Specifically, the second pulse signal is a signal indicative that no more than a predetermined period has elapsed since the alternating current voltage Vac has passed the zero-crossing point.

FIG. 4 also depicts an example of the second pulse signal. In the second pulse signal of HG 4, a case where the predetermined period or less has elapsed since the value of the alternating current voltage Vac passed the zero-crossing point is indicated by "H," and a case where the predetermined period or more has elapsed since the zero-crossing point was passed is indicated by "L."

The logical AND circuit 32 is a so-called AND circuit having two input terminals and a single output terminal. Each of the input terminals of the logical AND circuit 32 is connected to the output of the calculation unit 31 and to the output of the voltage detection circuit 27, respectively. The output terminal of the logical AND circuit 32 is connected to the gate terminal of the switching element 24. The logical AND circuit 32 calculates, and outputs to the switching element 24, logical AND between the first pulse signal indicative of the voltage Vigbt at both ends of the switching element 24 detected by the voltage detector 25, and the second pulse signal.

For example, because the second pulse signal is an "L" in the intervals M1 and in3 of FIG. 4, the logical AND circuit 32 outputs a gate voltage "L" to the switching element 24. Because the second pulse signal is an "H" in the interval in2 of FIG. 4, the logical AND circuit 32 outputs a gate voltage "H" to the switching element 24 on the basis of the first pulse signal. The voltage Vigbt at both ends of the switching element 24 during the interval in2 of FIG. 4 is about 0V, but within the interval in2, the first pulse signal "H" is inputted into the logical AND circuit 23 on the basis of the value of the voltage Vigbt at both ends immediately prior to the interval in2 (in other words, within the interval in1).

Figure 5:
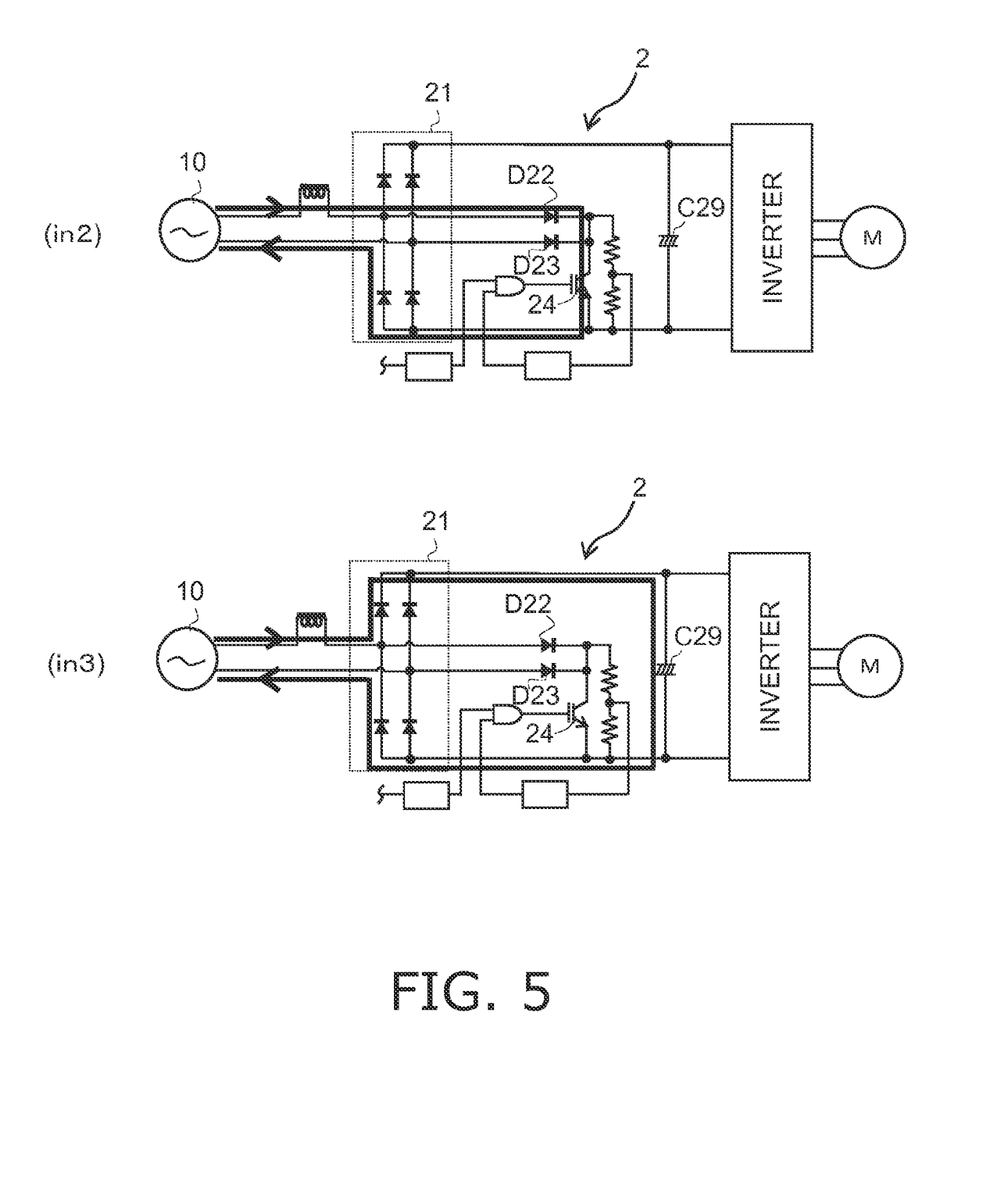
FIG. 5 is a drawing illustrating a pathway of a current flowing through the reverse recovery current prevention device in each of an interval in2 and an interval in3 in FIG. 4.

(3) Operation
(3-1) Operation of the Reverse Recovery Current Prevention Device and Flow of Currents The flow of operations of the reverse recovery current prevention device 2 according to the present embodiment and the current flowing through the reverse recovery current prevention device 2 shall now be described on the basis of FIGS. 4 and 5. FIG. 5 is a drawing illustrating the flow of current flowing through the reverse recovery current prevention device 2 in a case where a positive-voltage power source voltage Vac is applied to the first input terminal s1, as one example.

Immediately after the power source voltage Vac arrives at the zero-crossing point in a state where the switching element 24 has been turned off, a positive-voltage power source voltage Vac begins to be applied to the first input terminal s1 (or, alternatively, a negative-voltage power source voltage Vac to the second input terminal t1) (the interval in1). In so doing, the input current flows out from the alternating current power source 10 toward the full wave rectifier 21, and the gate voltage "H" is applied to the switching element 24 for a predetermined period (the interval in2). The switching element 24 is thereby turned on. Then, at such a time, because the power source voltage Vac is lower than the direct current voltage Vdc (Vac<Vdc), the input current, as illustrated in (in2) of FIG. 5, flows from the alternating current power source 10 through the first diode D22 (or the second diode D23), the switching element 24, and the negative-side output terminal of the full wave rectifier 21, to the alternating current power source 10. At such a time, the voltage Vigbt at both ends of the switching element 24 becomes "0V".

After the gate voltage "H" has been applied to the switching element 24 during the predetermined period, the switching element control unit 30 applies the gate voltage "L" to the switching element 24 (the interval in3). This causes the switching element 24 to be in a state of having been turned off and causes the voltage Vigbt at both ends of the switching element 24 to be the direct current voltage Vdc (Vigbt=Vdc). When the switching element 24 has been turned off, the input current momentarily stops flowing; however, when thereafter the power source voltage Vac becomes higher than the direct current voltage Vdc (Vac>Vdc), then the input current begins to flow into the full wave rectifier 21. In view of this, the switching element control unit 30 forcibly prohibits the turning on of the switching element 24 so as to prevent the switching element 24 from faultily turning on due to erratic performance of the microcomputer (not shown) when the voltage Vigbt at both ends of the switching element 24 becomes greater than the threshold. In so doing, the input current, as illustrated in (in3) of FIG. 5, flows from the alternating current power source 10 through the positive-side output terminal of the full wave rectifier 21, the smoothing condenser C29, and the negative-side output terminal of the full wave rectifier 21 to return to the alternating current power source 10; however, no input current flows to the switching element 24. In this interval, because there is also no reverse recovery current flowing through the reverse recovery current prevention device 2, no reverse recovery current will flow to the switching element 24.

The power source voltage Vac, having reached a peak, gradually becomes lower thereafter and eventually becomes the direct current voltage Vdc or lower. In so doing, the input current stops flowing and eventually becomes "0 A". At such a time, too, because the state where the switching element 24 has been turned off is held, the voltage Vigbt at both ends of the switching element 24 becomes the power source voltage Vac (the interval in1, Vigbt=Vac).

Figure 6A:
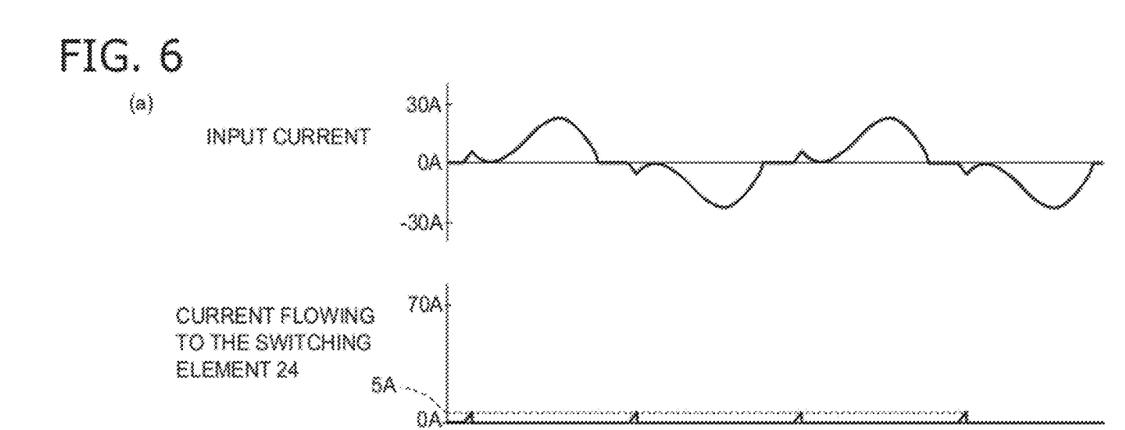
Figure 6B:
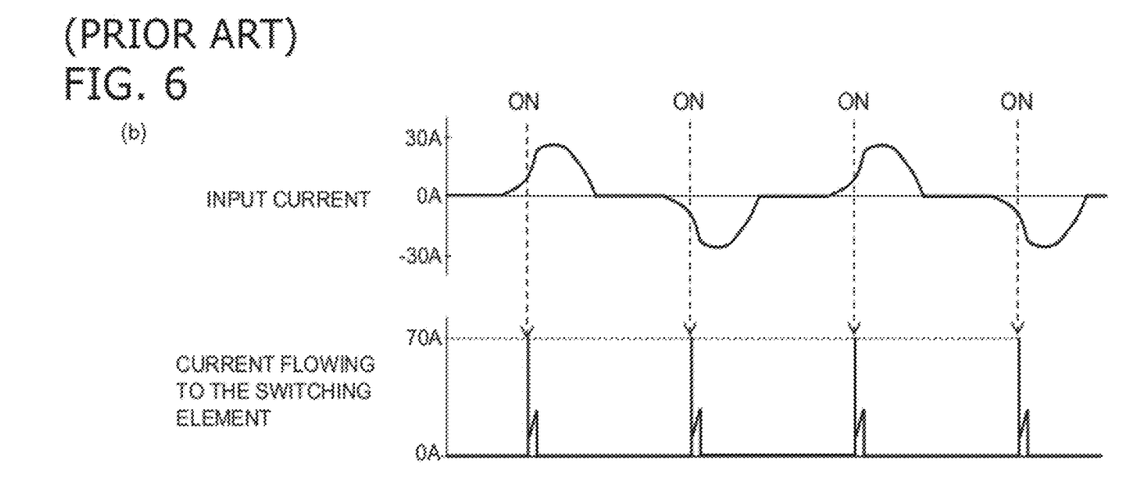

(3-2) Comparison Results of the Current Value Flowing Into the Switching Element FIG. 6A is a graph illustrating the value of the current that flows into the switching element 24 in the case of the present embodiment where, while the input current is flowing to the full wave rectifier 21, the switching element 24 is forcibly prohibited from turning on. FIG. 6B is a graph illustrating the value of the current that flows into the switching element in a conventional example where, while the input current is flowing to the full wave rectifier, the switching element is allowed to turn on.

In FIG. 6B, as the switching element turns on, a current of about 70 A instantly flows. However, in FIG. 6A, while the switching element 24 is turned on tier only a predetermined period after the vicinity of the zero-crossing of the power source voltage Vac, a current of about 5 A does flow to the switching element 24, but while much of the input current actually flows to the full wave rectifier 21, the switching element 24 is in a state of having been forcibly turned off, and therefore, a transient current such as is illustrated in FIG. 6B is prevented from flowing to the switching element 24.

(4) Effects
(A)

According to the reverse recovery current prevention device 2 according to the present embodiment, in a case where the voltage between the second wiring OL2 (specifically, the negative-side voltage terminal of the full wave rectifier 21) and each of the cathode terminals s3, t3 of the first and second diodes D22, D23; i.e., the voltage at both ends of the switching element 24, is high, equaling or exceeding the threshold, in terms of the circuitry configuration in FIG. 2, it is anticipated that the input current will flow from the alternating current power source 10 to the full wave rectifier 21. In view of this, in such a case, the switching element control unit 30 prohibits the switching element 24 from shorting the electrical circuit between the second wiring OL2 and each of the cathode terminals s3, t3 of the first and second diodes D22, D23. This causes a state where the electrical circuit is opened between the negative-side voltage terminal of the full wave rectifier 21 and each of the cathode terminals s3, t3 of the first and second diodes D22, D23 while the input current is flowing to the full wave rectifier 21, and prevents the formation of a current pathway for the reverse recovery current, and therefore no reverse recovery current will flow the switching element 24. It is accordingly possible to prevent the switching element 24 from being destroyed.

(B)

The switching element control unit 30 of the present embodiment compares the voltage at both ends of the switching element 24 as detected by the voltage detector 25 against the threshold. This allows the switching element control unit 30 to identify the voltage at both ends of the switching element 24 and to control the state of the switching element 24 by the comparison between the voltage at both ends of the switching element 24 and the threshold.

(C)

The switching element control unit 30 of the reverse recovery current prevention device 2 according to the present embodiment prohibits a short circuit on the basis of not only the voltage at both ends of the switching element 24 but also the zero-crossing of the power source voltage Vac as detected by the zero-crossing detector 28. For this reason, the reverse recovery current prevention device 2 is able to more reliably prevent the switch part from being destroyed.

(D)

According to the reverse recovery current prevention device 2 of the present embodiment, the switching element control unit 30 can be constituted merely of the calculation unit 31 and the logical AND circuit 32.

(E)

The switching element control unit 30 of the reverse recovery current prevention device 2 according to the present embodiment causes the electrical circuit between the negative-side output terminal and each of the cathode terminals s3, t3 to be shorted by the switching element 24 at such a time where the input current flows out from the alternating current power source 10 to the full wave rectifier 21, the timing being in the vicinity of the zero-crossing of the power source voltage Vac. The threshold is set to be higher than the power source voltage Vac when the switching element 24 shorts the electrical circuit between the second wiring OL2 and each of the cathode terminals s3, t3. This makes it possible for the threshold to be made a value suited to the control for forcibly prohibiting the switching element 2 from turning on.

(F)

In a case where the direct current voltage Vdc is lower than the power source voltage Vac and the input current is flowing from the alternating power source 10 to the full wave rectifier 21, the risk may arise where a so-called reverse recovery current will flow to the switching element 24. However, in the reverse recovery current prevention device 2 of the present embodiment, the threshold used in the control for beginning to forcibly prohibit the switching element 24 from turning on is set to be lower than the power source voltage Vac (tp1 in FIG. 4) when the direct current voltage Vdc becomes lower than the power source voltage Vac and the current begins to flow from the alternating current power source 10 to the full wave rectifier 21. For this reason, it is possible to forcibly prohibit the switching element 24 from turning on in advance of a state being reached where the prevailing relationship in which the direct current voltage Vdc is lower than the power source voltage Vac is reversed so that the direct current voltage Vdc is higher than the power source voltage Vac (Vdc>Vac), and the need arises to give consideration to the reverse recovery current. It is accordingly possible to more reliably prevent the switching element 24 from being destroyed.

(G)

Of the reverse recovery current, a transient current flowing into the switching element 24 the instant where the switching element 24 is turned on in particular is a source of noise of the various machines provided to the periphery of the motor driving apparatus 1, and there is presumably also an adverse effect on, for example, the microcomputer (not shown) for controlling the driving of the inverter and on other elements of the motor driving apparatus 1. However, the motor driving apparatus 1 according to the present embodiment has the aforesaid reverse recovery current prevention device 2 built into the motor driving apparatus 1, and therefore no reverse recovery current will flow the switching element 24. Accordingly, the motor driving apparatus 1 can drive the motor 11 without problems and without being affected by any reverse recovery current.

OTHER EMBODIMENTS

The aforesaid embodiment has described the case where the switching element 24 is constituted of an insulated gate bipolar transistor. However, the switching element 24 may be constituted in any manner, provided that the switching element 24 is able to short or open the circuit between the second wiring OL2 and each of the cathode terminals s3, t3 of the first diode D22 and the second diode D23. Examples of other possible configurations of the switching element 24 include a bipolar transistor, a MOS transistor, a thyristor, or a TRIAC.

INDUSTRIAL APPLICABILITY

The reverse recovery current prevention device of the present invention has the effect of being able to prevent the switch part from being destroyed. The reverse recovery current prevention device can be applied as a device within a motor driving apparatus such as an outdoor fan in an outdoor unit of an air conditioning apparatus.

REFERENCE SIGNS LIST

1: Motor driving apparatus
2: Reverse recovery current prevention device
5: Inverter unit
10: Alternating current power source
11: Motor
12: Outdoor fan
21: Full wave rectifier
D22: First diode
D23: Second diode
24: Switching element
25: Voltage detector
R26a, R26b: Resistor
27: Voltage detection circuit
28: Zero-crossing detector
C29: Smoothing condenser
30: Switching element control unit
31: Calculation unit
32: Logical AND circuit
100: Motor driving system
P1: Printed substrate

CITATION LIST

Patent Literature

Patent Citation 1: Japanese Laid-open Patent Publication 2007-274818

What is claimed is:

1. A reverse recovery current prevention device comprising:
a full wave rectifier configured to rectify a power source voltage from an alternating current power source inputted into a first input terminal and a second input terminal, the full wave rectifier having a plurality of diodes;
a first diode having an anode terminal connected to the first input terminal of the full wave rectifier;
a second diode having an anode terminal connected to the second input terminal of the full wave rectifier;
a switch part configured to open or short an electrical circuit between a negative-side output terminal of the full wave rectifier and each of a cathode terminal of the first diode and a cathode terminal of the second diode, the switch part being connected between the negative-side output terminal and each of the cathode terminals; and
a switch control unit configured to prohibit the switch part from shorting the electrical circuit between the negative-side output terminal and each of the cathode terminals when a voltage between the negative-side output terminal and each of the cathode terminals is at or above a threshold.

2. The reverse recovery current prevention device according to claim 1, further comprising:
a voltage detector configured to detect the voltage between the negative-side output terminal and each of the cathode terminals,
the switch control unit being further configured to compare a first detection result from the voltage detector with the threshold.

3. The reverse recovery current prevention device according to claim 2, further comprising:
a zero-crossing detector configured to detect a zero-crossing of the power source voltage,
the switch control unit being further configured to prohibit the switch part from shorting the electrical circuit between the negative-side output terminal and each of the cathode terminals based on a second detection result from the zero-crossing detector.

4. The reverse recovery current prevention device according to claim 3, wherein
the switch part includes a switching element, and
the switch control unit includes
a signal output unit configured to output a second pulse signal relating to the threshold based on the second detection result from the zero-crossing detector, and
a logical AND circuit configured to calculate, and output to the switching element, a logical AND between the second pulse signal and a first pulse signal indicating the first detection result from the voltage detector.

5. The reverse recovery current prevention device according to claim 1, wherein
the switch control unit is further configured to cause the electrical circuit between the negative-side output terminal and each of the cathode terminals to be shorted by the switch part when the current is flowing out from the alternating current power source toward the full wave rectifier, at a timing in a vicinity of the zero-crossing of the power source voltage, and
the threshold is set to be higher than the power source voltage when the switch part shorts the electrical circuit between the negative-side output terminal and each of the cathode terminals.

6. The reverse recovery current prevention device according to claim 1, further comprising:
a smoothing unit configured to smooth the power source voltage that has having been rectified by the full wave rectifier generate a direct current voltage,
the threshold being set to be lower than the power source voltage when current is flowing out from the alternating current power source toward the full wave rectifier, because the direct current voltage is lower than the power source voltage.

7. A motor driving apparatus including the reverse recovery current prevention device according to claim 1, the motor driving apparatus being configured to drive a motor, the motor driving apparatus further comprising:
an inverter unit configured to output, to the motor, a driving voltage to drive the motor, the inverter unit comprising a plurality of switching elements which are connected in series with each other,
the reverse recovery current prevention device being provided to an upstream part of the inverter unit.

8. The reverse recovery current prevention device according to claim 4, wherein
the switch control unit is further configured to cause the electrical circuit between the negative-side output terminal and each of the cathode terminals to be shorted by the switch part when the current is flowing out from the alternating current power source toward the full wave rectifier, at a timing in a vicinity of the zero-crossing of the power source voltage, and
the threshold is set to be higher than the power source voltage when the switch part shorts the electrical circuit between the negative-side output terminal and each of the cathode terminals.

9. The reverse recovery current prevention device according to claim 4, further comprising:
a smoothing unit configured to smooth the power source voltage that has been rectified by the full wave rectifier to generate a direct current voltage,
the threshold being set to be lower than the power source voltage when current is flowing out from the alternating current power source toward the full wave rectifier, because the direct current voltage is lower than the power source voltage.

10. A motor driving apparatus including the reverse recovery current prevention device according to claim 4, the motor driving apparatus being configured to drive a motor, the motor driving apparatus further comprising:
an inverter unit configured to output, to the motor, a driving voltage to drive the motor, the inverter unit comprising a plurality of switching elements which are connected in series with each other,
the reverse recovery current prevention device being provided to an upstream part of the inverter unit.

* * * * *